United States Patent [19]

Wolf et al.

[11] Patent Number: 4,658,222
[45] Date of Patent: Apr. 14, 1987

[54] RADIATION DETECTOR SPECTRUM SIMULATOR

[75] Inventors: Michael A. Wolf; John M. Crowell, both of Los Alamos, N. Mex.

[73] Assignee: The United States of America as represented by the Department of Energy, Washington, D.C.

[21] Appl. No.: 721,352

[22] Filed: Apr. 9, 1985

[51] Int. Cl.⁴ .................. H03B 29/00; H03K 3/84
[52] U.S. Cl. .................................. 331/78; 331/46; 328/59
[58] Field of Search ............... 331/46, 78; 250/252.1; 328/59, 60, 61, 63

[56] References Cited

U.S. PATENT DOCUMENTS 3,816,765  6/1974  Goyer ............................ 331/78

FOREIGN PATENT DOCUMENTS 158603  1/1983  Fed. Rep. of Germany ........ 331/78

Primary Examiner—Siegfried H. Grimm
Attorney, Agent, or Firm—Leonard C. Brenner; Ray G. Wilson; Judson R. Hightower

[57] ABSTRACT

A small battery operated nuclear spectrum simulator having a noise source generates pulses with a Gaussian distribution of amplitudes. A switched dc bias circuit cooperating therewith generates several nominal amplitudes of such pulses and a spectral distribution of pulses that closely simulates the spectrum produced by a radiation source such as Americium 241.

20 Claims, 2 Drawing Figures

RADIATION DETECTOR SPECTRUM SIMULATOR

BACKGROUND OF THE INVENTION

The present invention relates generally to radiation spectrum generators and more specifically to portable radiation detector simulators for testing, servicing, and calibrating spectrometer circuits and radiation instruments. This invention is the result of a contract with the Department of Energy (Contract No. W-7405-ENG-36).

It is often inconvenient to use a radioactive source and detector to test or demonstrate a nuclear multichannel analyzer. Transportation regulations regarding the carrying of radioactive sources and the expense, fragility, and bulk of detectors combine to make it difficult to carry test sources and detectors into the field.

Furthermore, the cost of the radioactive source and detector is often excessive with respect to the immediate financial benefit of the test or demonstration of the nuclear multichannel analyzer.

Therefore, it is an object of the present invention to provide an apparatus for testing and demonstrating nuclear analyzers and other radiation instrumentation without the need for a radioactive source.

It is another object of the present invention to provide a low-cost portable radioactive source simulator for demonstrating, testing, and calibrating radiation instrumentation.

SUMMARY OF THE INVENTION

To achieve the foregoing and other objects, and in accordance with the purposes of the present invention, as embodied and broadly described herein, the apparatus of this invention may comprise a small battery operated nuclear spectrum simulator having a noise source to generate pulses with a Gaussian distribution of amplitudes and a switched dc bias circuit cooperating therewith to generate several nominal amplitudes of such pulses and a spectral distribution of pulses that closely simulates the spectrum produced by a radiation source such as Americium 241.

An advantage of the present invention is that radiation instruments may be tested, serviced, and calibrated without requiring the presence of a radiation source.

Another advantage of the present invention is that a small low-cost portable radiation source simulator is provided for field testing and demonstration of radiation instrumentation.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE PRESENT INVENTION

Figure 1:
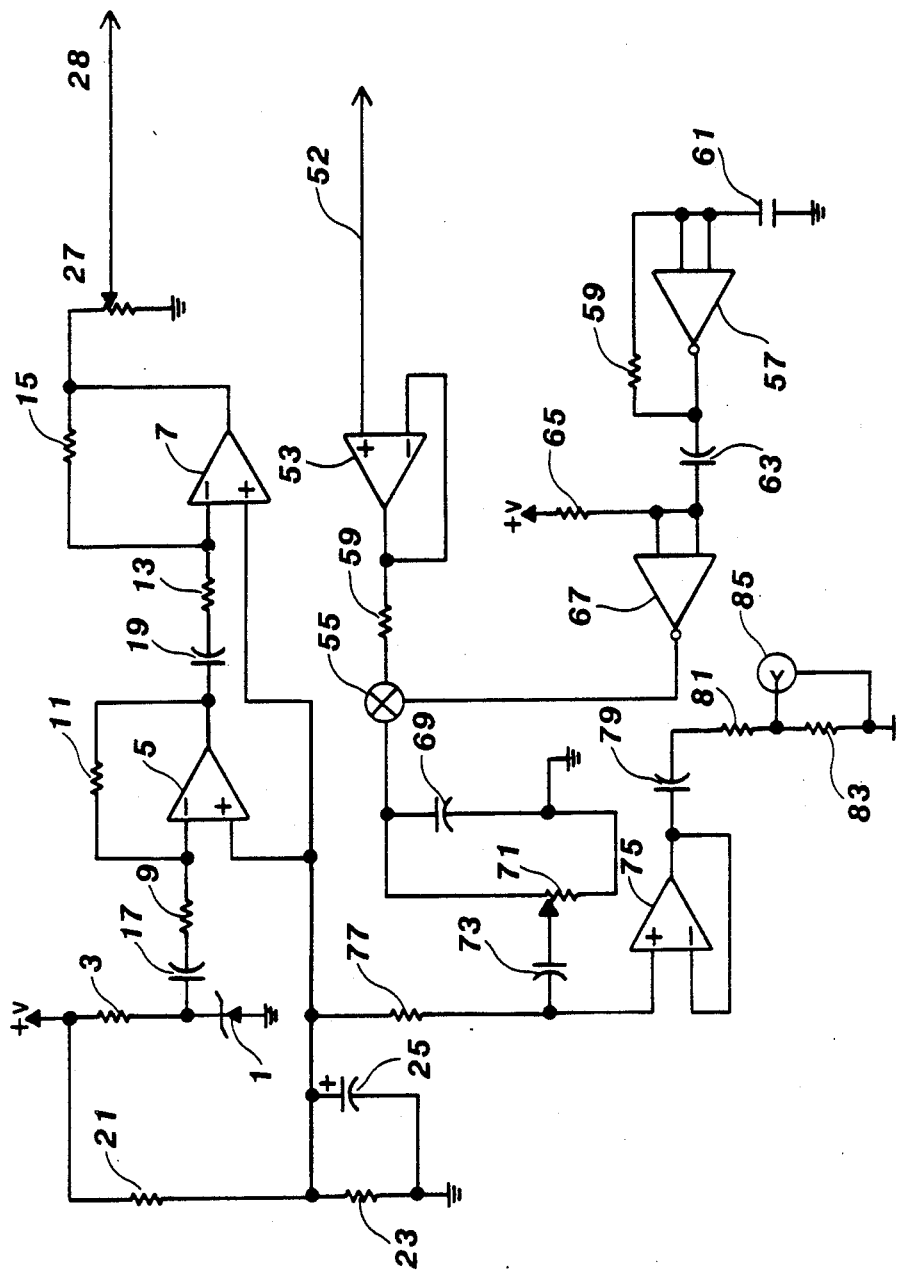
FIGS. 1 and 2 together form a schematic of the present invention.
Figure 2:
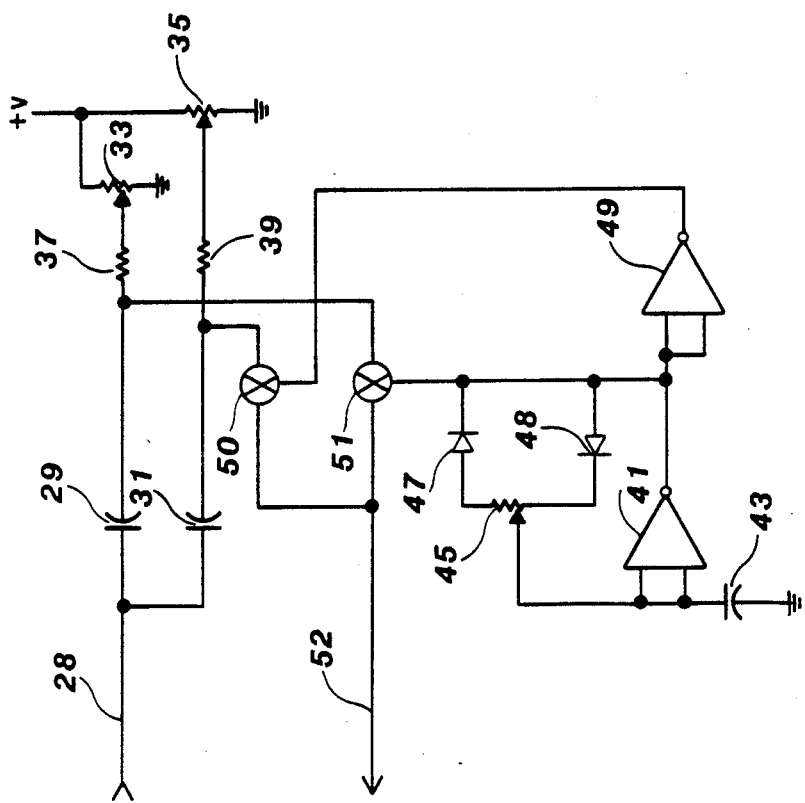

As shown in FIGS. 1 and 2, a zener diode 1 is biased in the breakdown region by resistor 3. The breakdown noise is amplified by amplifiers 5 and 7 with their associated gain setting resistors 9, 11, 13, and 15 and coupling capacitors 17 and 19. The amplifiers are biased by resistors 21 and 23 and decoupling capacitor 25. This amplifier noise is selectively attenuated by width potentiometer 27 and coupled through dc blocking capacitors 29 and 31. A dc bias is supplied to the other side of these capacitors by the height potentiometers 33 and 35 and isolation resistors 37 and 39.

A Schmidt trigger gate 41 with capacitor 43, ratio potentiometer 45 and diodes 47 and 48 form a square wave oscillator whose duty cycle is variable (via 45) from 5% to 95%. This oscillator runs at about 50 Hz. The output of this oscillator and its inverse (obtained from gate 49) are used to control analog switches 50 and 51. These switches alternately select the two signals made up of the dc voltage from the height potentiometers 33 and 35 summed with the output of the noise amplifier 7. The result measured on line 52 is a square wave whose duty cycle is varied by the ratio potentiometer 45 and whose amplitude of each part is set by the height potentiometers 33 and 35 and the instantaneous output of the noise amplifier 7. This signal is buffered by amplifier 53 and fed to analog switch 55. This switch is controlled by a pulse of approximately 1 µs width at a repetition rate of approximately 2 kHz. This pulse is generated by an oscillator comprising gate 57, resistor 59, and capacitor 61 and a pulse shaper comprising differentiation capacitor 63, resistor 65, and gate 67.

When the pulse switches on switch 55, the storage capacitor 69 is charged through rise-time control resistor 71 to the instantaneous voltage on the output of amplifier 53. When the switch 55 opens, the capacitor 69 discharges through gain potentiometer 71. The time constant of this network gives rise to the characteristic short-rise, long-tail shape of a pulse from a nuclear detector.

The pulses are coupled through dc blocking capacitor 73 to buffer amplifier 75 and bias resistor 77. The output of the amplifier 75 is coupled through dc blocking capacitor 79 to the output attenuator (resistors 81 and 83) and then to the output connector 85. The result is a series of shaped pulses whose amplitude varies in a Gaussian distribution about two fixed amplitudes. This produces a spectral distribution of pulses that closely resembles the spectrum produced by Americium 241.

In the preferred embodiment of the invention certain specific elements may be incorporated. Amplifiers 5, 7, 53, and 57 may be of type 7641, gates 41, 49, 57, and 67 may be of type 4093, and analog switches 50, 51, and 55 may be of type 4066. Resistor 83 may be 910 Ω, resistors 37, 39, and 77 may all be 22 kΩ, resistors 11, 21, 23, and 59 may all be 100 kΩ resistors, and resistor 15 may be a 240 kΩ resistor. Potentiometers 27, 33, 35, and 71 may be 10 kΩ while potentiometer 45 may be 200 kΩ. Capacitor 63 may be 150 pf, capacitor 69 1000 pf, capacitor 61 3900 pf, 17, 19, 29, 31, 43, and 73 a 0.1 µfd, 79 a 4.7 µfd, and 25 a 6.8 µfd capacitor. Diodes 47 and 48 may be of type 1N4154 while zener diode 1 may be of type 1N4736.

The foregoing description of the preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What we claim is:

1. A portable battery powerable nuclear spectrum simulator comprising:
    noise source means for generating pulses with a Gaussian distribution of amplitudes;
    switched dc biased means for modulating the amplitude of pulses generated by said noise source means; and
    pulse shaping means fed by said switched dc bias means for generating short rise and long tail pulses therefrom, thereby producing a spectral distribution of pulses that closely simulates the spectrum produced by a radiation source.

2. The portable battery powerable nuclear spectrum simulator according to claim 1 wherein said noise source means includes a zener diode biased in its breakdown region to function as a noise generator.

3. The portable battery powerable nuclear spectrum simulator according to claim 2 wherein said zener diode is a 1N4736 zener diode.

4. The portable battery powerable nuclear spectrum simulator according to claim 1 wherein the simulated radiation source is an Americium 241 radiation source.

5. The portable battery powerable nuclear spectrum simulator according to claim 2 wherein the simulated radiation source is an Americium 241 radiation source.

6. A battery powerable nuclear spectrum simulator comprising:
    a zener diode biased in its breakdown region to generate noise;
    amplifying means for amplifying noise generated by said zener diode;
    a plurality of dc bias sources;
    an adjustable duty cycle square-wave generator;
    analog switching means controlled by said square wave generator and imputted by said plurality of dc bias sources and noise amplified by said amplifying means for providing a composite signal thereof; and
    means for shaping said composite signal to produce output pulses having a short risetime and a long trailing-edge, whereby a spectral distribution of pulses are generated resembling the spectrum produced by a radiation source.

7. The battery powerable nuclear spectrum simulator according to claim 6 wherein said plurality of dc bias sources consists of two dc bias sources.

8. The battery powerable nuclear spectrum simulator according to claim 7 wherein said zener diode is a 1N4736 zener diode.

9. The battery powerable nuclear spectrum simulator according to claim 7 wherein the simulated radiation source is an Americium 241 radiation source.

10. The battery powerable nuclear spectrum simulator according to claim 6 wherein said adjustable duty cycle square-wave generator is adjustable in duty cycle from about 5% to about 95%.

11. The battery powerable nuclear spectrum simulator according to claim 6 wherein said adjustable duty cycle square-wave generator operates at a frequency of about 50 Hz.

12. The battery powerable nuclear spectrum simulator according to claim 11 wherein said adjustable duty cycle square-wave generator is adjustable in duty cycle from about 5% to about 95%.

13. The battery powerable nuclear spectrum simulator according to claim 11 wherein said means for shaping includes:
    a shaping analog switch for selectively passing and blocking the composite signal provided from said analog switching means;
    pulse generating means for generating short duration pulses at a fixed frequency; and
    a pulse shaping circuit fed by said pulse generating means and connected to said shaping analog switch for controlling the passing and blocking of the composite signal.

14. The battery powerable nuclear spectrum simulator according to claim 13 wherein said short duration pulses generated by said pulse generating means are substantially 1 $\mu$s duration pulses and wherein the fixed frequency is approximately 2 kHz.

15. The battery powerable nuclear spectrum simulator according to claim 13 wherein said pulse generating means includes an RC oscillator.

16. The battery powerable nuclear spectrum simulator according to claim 14 wherein said pulse generating means includes an RC oscillator.

17. A battery powerable nuclear spectrum simulator comprising:
    a zener diode biased in its breakdown region to generate noise;
    amplifying means for amplifying noise generated by said zener diode;
    two dc bias sources;
    a square wave generator operating at about 50 Hz and having a duty cycle adjustable from about 5% to about 95%;
    analog switch means controlled by said square wave generator and inputted by said two dc bias sources and noise amplified by said amplifying means for providing a composite signal thereof; and
    means for shaping the composite signal to produce output pulses having a short risetime and a long trailing edge, said means for shaping having
        a shaping analog switch for selectively passing and blocking the composite signal provided from said analog switching means;
        pulse generating means for generating short duration pulses at a fixed frequency; and
        a pulse shaping circuit fed by said pulse generating means and connected to said shaping analog switch for controlling the passing and blocking of the composite signal.

18. The battery powerable nuclear spectrum simulator according to claim 17 wherein said short duration pulses generated by said pulse generating means are substantially 1 $\mu$s duration pulses and wherein the fixed frequency is approximately 2 kHz.

19. The battery powerable nuclear spectrum simulator according to claim 17 wherein said pulse generating means includes an RC oscillator.

20. The battery powerable nuclear spectrum simulator according to claim 18 wherein said pulse generating means includes an RC oscillator.

* * * * *